(12) United States Patent
Yang et al.

(10) Patent No.: US 9,299,679 B2
(45) Date of Patent: Mar. 29, 2016

(54) HIGH RELIABILITY SEMICONDUCTOR PACKAGE STRUCTURE

(71) Applicant: Anova Technologies Co., Ltd., Taichung (TW)

(72) Inventors: Wei-Li Yang, Taichung (TW); Tsung-Chieh Chou, Taichung (TW); Tzu-Chiang Wang, I, Taichung (TW); Tsang-Sheng Chang, Taichung (TW)

(73) Assignee: Anova Technologies Co., Ltd., Taichung (TW)

( * ) Notice: Subject to any disclaimer, the term of this patent is extended or adjusted under 35 U.S.C. 154(b) by 0 days.

(21) Appl. No.: 14/301,978

(22) Filed: Jun. 11, 2014

(65) Prior Publication Data

US 2015/0243587 A1     Aug. 27, 2015

(30) Foreign Application Priority Data

Feb. 26, 2014   (TW) .............................. 103106596 A

(51) Int. Cl.
| | |
|---|---|
| *H01L 23/34* | (2006.01) |
| *H01L 23/00* | (2006.01) |
| *H01L 23/495* | (2006.01) |
| *H01L 23/043* | (2006.01) |
| *H01L 23/433* | (2006.01) |
| *H01L 23/31* | (2006.01) |
| *H01L 29/06* | (2006.01) |

(52) U.S. Cl.
CPC .............. *H01L 24/33* (2013.01); *H01L 23/043* (2013.01); *H01L 23/4334* (2013.01); *H01L 23/49524* (2013.01); *H01L 23/49551* (2013.01); *H01L 24/36* (2013.01); *H01L 24/40* (2013.01); *H01L 23/3107* (2013.01); *H01L 23/3171* (2013.01); *H01L 23/49555* (2013.01); *H01L 23/49568* (2013.01); *H01L 29/0657* (2013.01); *H01L 2224/32245* (2013.01); *H01L 2224/33181* (2013.01); *H01L 2224/40095* (2013.01); *H01L 2224/40245* (2013.01); *H01L 2224/73263* (2013.01); *H01L 2924/01029* (2013.01); *H01L 2924/12035* (2013.01); *H01L 2924/12036* (2013.01); *H01L 2924/1715* (2013.01); *H01L 2924/181* (2013.01)

(58) Field of Classification Search
CPC ............ H01L 2224/48247; H01L 2224/48472
See application file for complete search history.

(56) References Cited

U.S. PATENT DOCUMENTS

| | | | | |
|---|---|---|---|---|
| 7,834,433 | B2 * | 11/2010 | Xiaochun et al. | 257/675 |
| 8,198,709 | B2 * | 6/2012 | Chou et al. | 257/659 |
| 2005/0093131 | A1 * | 5/2005 | Nakase et al. | 257/693 |
| 2005/0121701 | A1 * | 6/2005 | Hirano et al. | 257/287 |
| 2005/0145999 | A1 * | 7/2005 | Mamitsu et al. | 257/667 |
| 2009/0014863 | A1 * | 1/2009 | Chiang et al. | 257/706 |
| 2012/0001308 | A1 * | 1/2012 | Fukutani et al. | 257/675 |

* cited by examiner

*Primary Examiner* — John C Ingham
(74) *Attorney, Agent, or Firm* — Juan Carlos A Marquez; Bacon & Thomas PLLC

(57) ABSTRACT

The present invention discloses a high reliability semiconductor package structure, which includes a lower heat sink, a die, an upper heat sink, a lead frame and a package body. The lead frame and the upper heat sink contain separately a first bending unit and a second bending unit that are electrically connected. The upper and lower heat sinks are attached to two opposite surfaces of the die and sink the high power transient heat generated at the die. The lower heat sink also has an indentation that circles the die and contains extra solder that might otherwise contaminate the die. Package body contains and protects the die, the upper and lower heat sinks and the lead frame. With the implementation of the invention, the reliability of the semiconductor package structure is promoted and the EMC durability together with the operable power is enhanced.

11 Claims, 7 Drawing Sheets

US 9,299,679 B2

HIGH RELIABILITY SEMICONDUCTOR PACKAGE STRUCTURE

This application claims priority to Taiwan Patent Application No. 103106596, filed on Feb. 26, 2014, which is hereby incorporated by reference.

BACKGROUND OF THE INVENTION

1. Technical Field

The present invention relates to semiconductor package structures, and more particularly, to a high-reliability semiconductor package structure.

2. Description of Related Art

Due to technological advancement, vehicular electronic systems are being rapidly incorporated into various types of vehicles. For instance, intricate and precise electronic circuit systems, such as vehicular inductive radar, vehicular hi-fi, and various vehicular safety systems are widely incorporated into and applied to various types of vehicles. However, EMC-related problems and voltage regulation-related problems which arise inevitably from electronic circuit systems are becoming more serious. For the details of the challenges posed by EMC or voltage regulation to the vehicular electronic circuit systems, refer to related international regulations, such as IEC7637 and JASO. DO-218(AB) published by the JEDEC is currently regarded as one of the recommended components for use in the solutions to EMC-related problems.

Referring to FIG. 1, a conventional DO-218(AB) package structure comprises a heat sink 401, a lead frame 402, a die 403, and a black glue 404. As indicated by its existing application and test data, the application of the conventional DO-218(AB) package structure is restricted to low-power EMC protection and low-power voltage regulation. But the conventional DO-218(AB) package structure cannot overcome the high power EMC impact requirements defined and regulated by strict regulations, such as IEC7637 and JASO-D001-94.

Referring to FIG. 2, the DO-218(AB) package structure fails to overcome the impact of high power EMC mainly because the heat generated from the die 403 is produced in a transient state (the instant when EMC occurs) and at a PN junction 405 of the semiconductor juncture of the die 403. Since the PN junction 405 and an insulating protective layer 406 of the die 403 must face upward (the insulating protective layer 406 of the die 403 cannot face downward, because if the insulating protective layer 406 faces downward, the insulating protective layer 406 will come into wide contact with the heat sink 401, thus deteriorating the production yield and causing severe component reliability-related problems), the lead frame 402 at the point of soldering cannot instantaneously and quickly absorb and dissipate heat dissipation; as a result, when subjected to the high-power EMC impact or operating in a high-temperature application environment, the products are confronted with serious malfunctioning-related problems. However, due to the rapid development and wide use of intricate vehicular electronic systems, the requirement set forth by IEC7637(IEC7637-2-5A, 5B) to require that protective components must be capable of enduring high-ampere current and long-term energy impact has already become a basic EMC requirement. In view of this, the structural specifications of the conventional DO-218(AB) package structure can no longer meet the demand for EMC or voltage regulation components of existing vehicular or industrial specifications.

BRIEF SUMMARY OF THE INVENTION

The present invention provides a high-reliability semiconductor package structure which comprises a lower heat sink, a die, an upper heat sink, a lead frame, and a package body. The upper heat sink and the lower heat sink are adhered tightly to two opposing surfaces of the die, respectively, to effectively absorb and dissipate transient high-power heat. The lower heat sink has a recess for surrounding the die to prevent a solder from overflowing and thus causing a short circuit to the product or causing reliability-related problems. The package body encloses and protects the die, the upper heat sink, a portion of the lead frame, and a portion of the lower heat sink. Given the implementation of the present invention, heat can be instantaneously and quickly absorbed and dissipated, so as to enhance the component reliability of the semiconductor package structure and augment its EMC durability or operable power.

The present invention provides a high-reliability semiconductor package structure, comprising: a lower heat sink made of a thermally conductive material and having an upper surface and a bottom surface, wherein an annular recess is formed on the upper surface to enclose an adhesion region of the upper surface; a die having a first surface fixedly coupled to the adhesion region and having a second surface opposing the first surface; an upper heat sink made of an electrically and thermally conductive material and having a connection portion and a first bending unit, the connection portion being adhered tightly to the second surface; a lead frame made of an electrically conductive material and having a second bending unit and a bent pin, the second bending unit being adhered tightly to the first bending unit, wherein a portion of the bent pin and the bottom surface are coplanar; and a package body for enclosing the die, the upper heat sink, a portion of the lead frame, and a portion of the lower heat sink, wherein the bent pin and the bottom surface are exposed from the package body.

Implementation of the present invention at least involves the following inventive steps:

1. enable the semiconductor package structure to operate in a strict usage environment, such as inside a vehicular engine room, at high temperature, at high pressure, or at a scene exposed to high electromagnetic interference;

2. enable the semiconductor package structure to absorb and dissipate heat instantaneously and quickly;

3. enable the semiconductor package structure to package high-power EMC protective components;

4. enable the semiconductor package structure to package high-power voltage regulation IC;

5. manufacture a DO-218(AB) package structure or a TO-220 package structure of standard package structure specifications and high industrial applicability; and 6. resist the impact of a high-ampere current generated from an input source when a component packaged by the semiconductor package structure is connected to a load circuit to be protected and thus protect the load circuit, so as to eliminate the threat posed by EMC (the high-ampere current is defined as a current of at least 2 A or of at least transient 50 A/300 ms.)

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

BRIEF DESCRIPTION OF THE SEVERAL VIEWS OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

Figure 1:
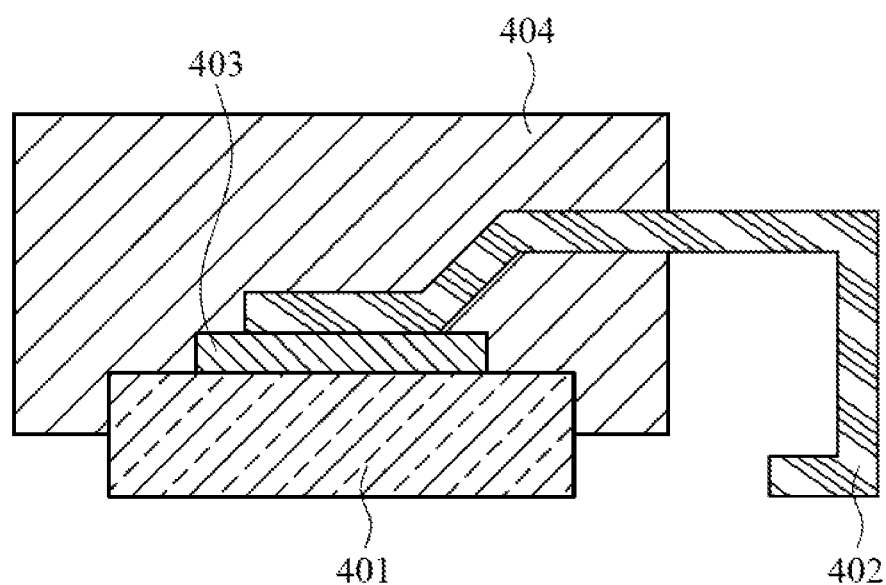
FIG. 1 (PRIOR ART) is a lateral cross-sectional view of a conventional DO-218 (AB) package structure.
Figure 2:
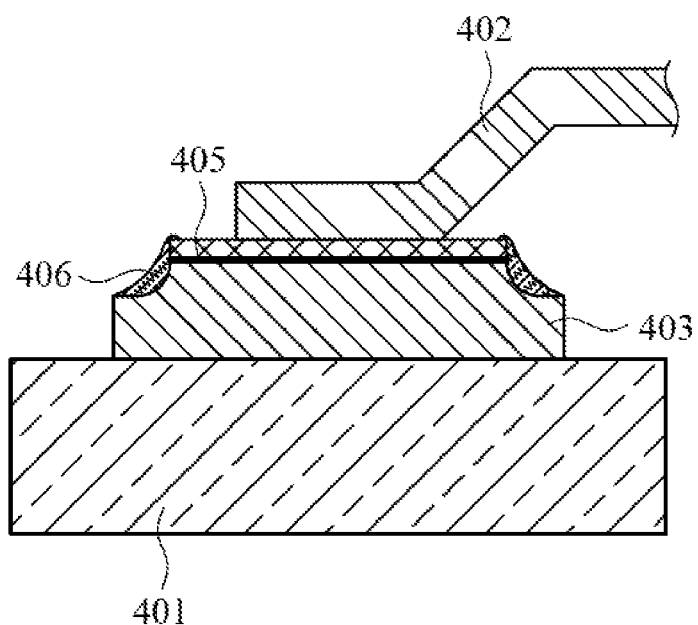
FIG. 2 (PRIOR ART) is a lateral cross-sectional view of another conventional DO-218 (AB) package structure.
Figure 3:
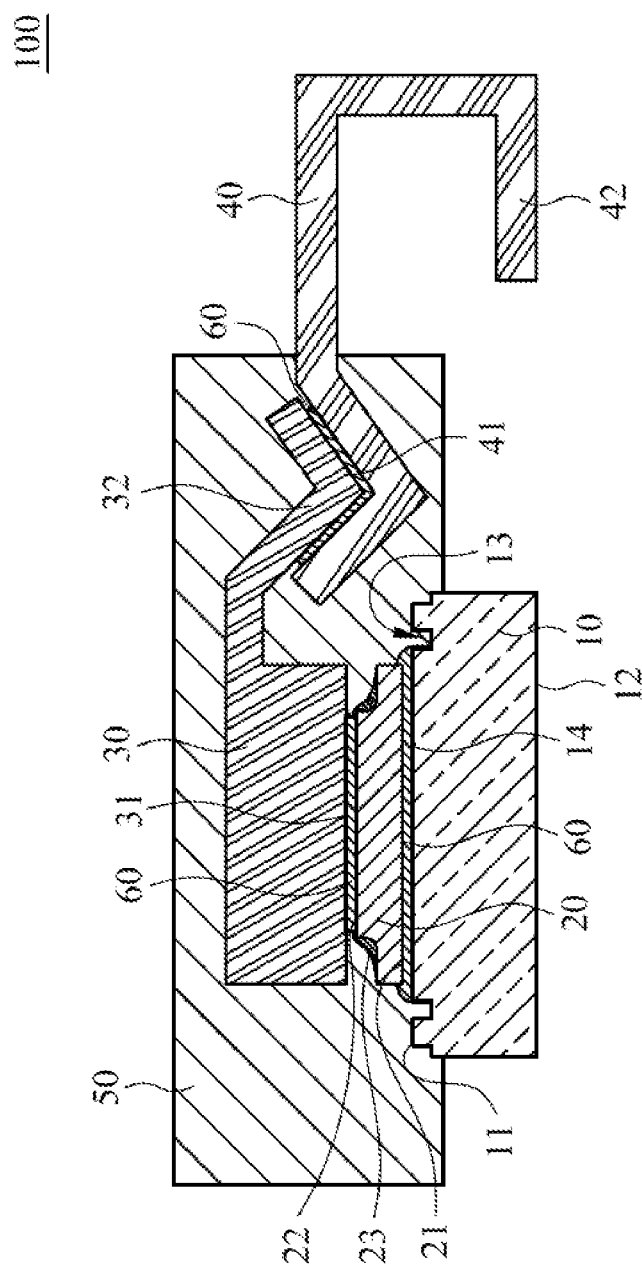
FIG. 3 is a lateral cross-sectional view of a high-reliability semiconductor package structure according to the embodiment of the present invention.

Referring to FIG. 3, in the embodiment of the present invention, a high-reliability semiconductor package structure 100 comprises a lower heat sink 10, a die 20, an upper heat sink 30, a lead frame 40 and a package body 50.

Figure 4:
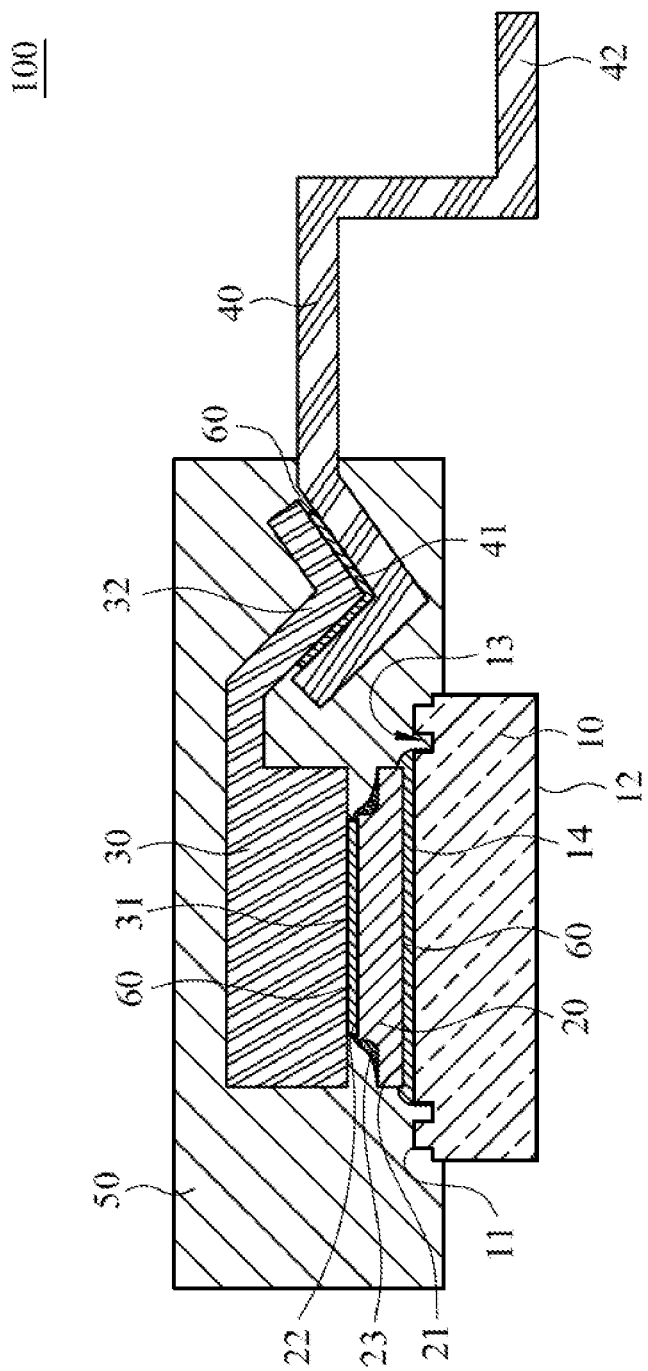
FIG. 4 is a lateral cross-sectional view of another high-reliability semiconductor package structure according to the embodiment of the present invention.

Referring to FIG. 3 and FIG. 4, the high-reliability semiconductor package structure 100 is manufactured to be a DO-218(AB) package structure or a TO-220 package structure, and is for use as a high power EMC protects component, a high power voltage regulation IC, a transient state voltage suppressing chip, or a Zener chip.

Referring to FIG. 3 and FIG. 4, the lower heat sink 10 is made of a thermally conductive material and has an upper surface 11 and a bottom surface 12. The upper surface 11 has an annular recess 13 which surrounds an adhesion region 14 of the upper surface 11. The lower heat sink 10 has a volume for absorbing a portion of the heat generated from the die 20 and dissipating the heat from its bottom. The recess 13 is U-shaped, V-shaped, or round, which is not restrictive of the present invention, as far as the manufacturing process is concerned.

Referring to FIG. 3 and FIG. 4, the die 20 is provided in the form of a transient state voltage suppressing chip or an electromagnetic interference suppressing chip. The die 20 has a first surface 21 fixedly coupled to the adhesion region 14 of the lower heat sink 10. The area of the adhesion region 14 is not less than the area of the first surface 21, such that the lower heat sink 10 is conducive to the heat dissipation of the die 20.

Furthermore, the die 20 has a second surface 22 opposing the first surface 21. Optionally, the die 20 has an insulating protective layer 23 for protecting a PN junction extended to the periphery of the die 20 to preclude a short circuit or external interference, so as to ensure the normal function and operation of the die 20.

Figure 5:
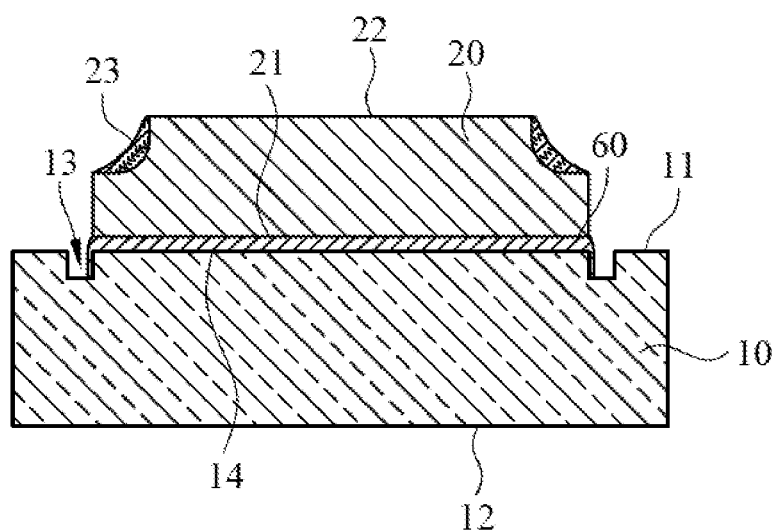
FIG. 5 is a lateral cross-sectional view of a lower heat sink and a die coupled together according to the embodiment of the present invention.

Referring to FIG. 3 through FIG. 5, in practice, the first surface 21 of the die 20 is soldered to the adhesion region 14 of the lower heat sink 10 by a solder 60. With the adhesion region 14 being surrounded by the recess 13, the redundant solder 60 which is left behind after the soldering process flows into the recess 13, such that the die 20 is unlikely to develop a short circuit which might otherwise be caused by solder overflow, nor are reliability-related problems likely to occur to compromise normal operation. Hence, the die 20 attains optimal operable power, and the component reliability of the high-reliability semiconductor package structure 100 is enhanced.

Referring to FIG. 3 and FIG. 4, the upper heat sink 30 is made of an electrically and thermally conductive material and has a connection portion 31 and a first bending unit 32. The connection portion 31 of upper heat sink 30 is adhered tightly to the second surface 22 of the die 20, wherein the tight adhesion is achieved by means of soldering with a solder 60. The area of the connection portion 31 is not less than the area of the die 20, so as to achieve efficient heat dissipation.

Referring to FIG. 3 and FIG. 4, the lead frame 40 is made of an electrically conductive material and has a second bending unit 41 and a bent pin 42. The second bending unit 41 of the lead frame 40 is adhered tightly to the first bending unit 32 of the upper heat sink 30. A portion of the bent pin 42 and the bottom surface 12 of the lower heat sink 10 are coplanar.

Both the second bending unit 41 of the lead frame 40 and the first bending unit 32 of the upper heat sink 30 have a V-shaped bend or a U-shaped bend corresponding in position to each other. It is feasible that the process of soldering and assembling the die 20, the adhesion region 14 and the connection portion 31 is synchronously accompanied by the process of soldering the second bending unit 41 and the first bending unit 32 with the solder 60, such that the bent pin 42 of the lead frame 40 comes into electrical conduction with the die 20 and thus become the signal or electrically connecting pin for the die 20.

Furthermore, the second bending unit 41 and the first bending unit 32 reduce physical stress otherwise caused by a temperature change. For instance, the lead frame 40 or the upper heat sink 30 is unlikely to compromise the normal operation of the die 20 under physical stress. The bent pin 42 bends in the direction of the die 20 as shown in FIG. 3 or bends in the direction away from the die 20 as shown in FIG. 4.

Figure 6:
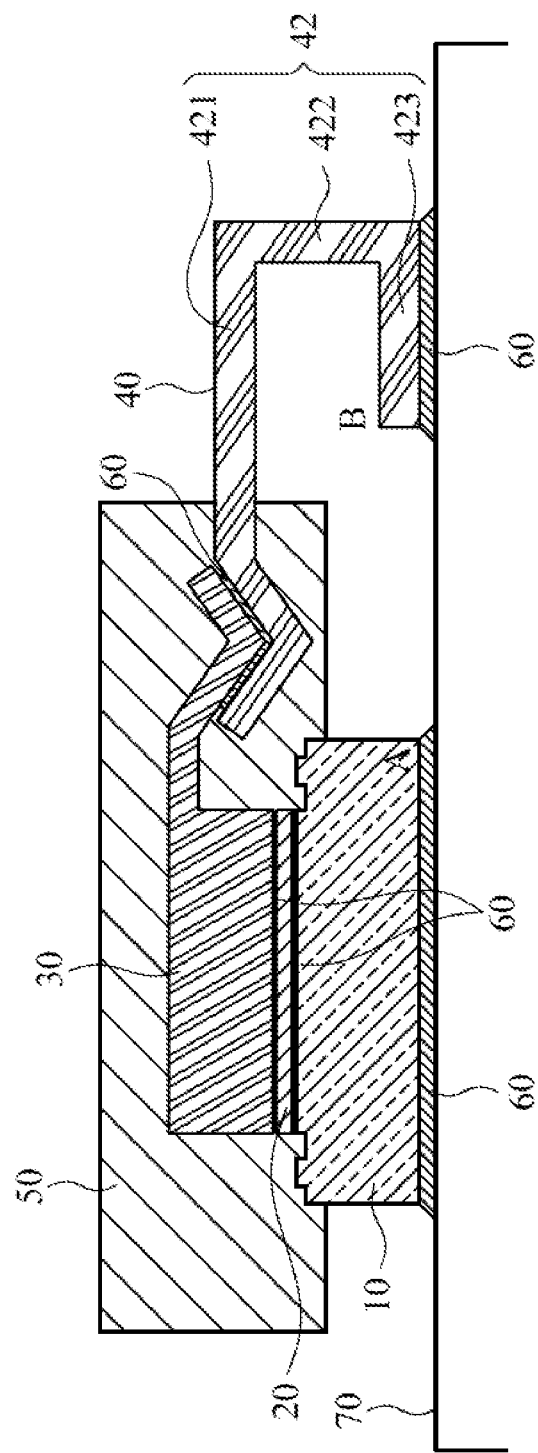
FIG. 6 is a lateral cross-sectional view of a high-reliability semiconductor package structure for use with a circuit board according to the embodiment of the present invention.

Referring to FIG. 6, the bent pin 42 of the lead frame 40 bends to form a first bending unit 421, a second bending unit 422 and a third bending unit 423, whereas the third bending unit 423 and the bottom surface 12 of the lower heat sink 10 are coplanar, so as to finalize the pin manufacturing process of the high-reliability semiconductor package structure 100. Hence, in practice, soldering the high-reliability semiconductor package structure 100 to a circuit board is easy and precise, thereby ensuring that the high-reliability semiconductor package structure 100 will operate well.

Referring to FIG. 3, FIG. 4 and FIG. 6, the upper heat sink 30 or the lower heat sink 10 is made of an electrically conductive and high-heat-dissipation material, such as a pure copper or a copper alloy, to ensure satisfactory electrical conduction, enhance ease of soldering with a solder, and enhance heat dissipation.

Referring to FIG. 3 and FIG. 6, the package body 50 encloses the die 20, the upper heat sink 30, a portion of the lead frame 40, and a portion of the lower heat sink 10, such that the bent pin 42 of the lead frame 40 and the bottom surface 12 of the lower heat sink 10 are exposed from the package body 50. Hence, the bent pin 42 and the bottom surface 12 are available for external electrical connection, and the heat dissipation of the die 20 is efficient. The package body 50 is a black glue, an epoxy resin, or a molding compound.

The high-reliability semiconductor package structure 100 in the aforesaid embodiments is characterized advantageously by: ease of production; low production costs; prevention of solder overflow-related problems; enhancement of resistance to impact of extreme temperature; long service life; enhancement of efficiency of heat dissipation of components; and enhancement of reliability and rated power of products. Furthermore, due to its aforesaid capability of high heat dissipation, the high-reliability semiconductor package structure 100 can sustain high-ampere current (the high-ampere current is defined as a stable current or continuous current of at least 2 A or a transient current of at least 50 A/300 ms, wherein A denotes ampere, and ms denotes a millisecond, i.e., a thousandth of a second.)

Figure 7:
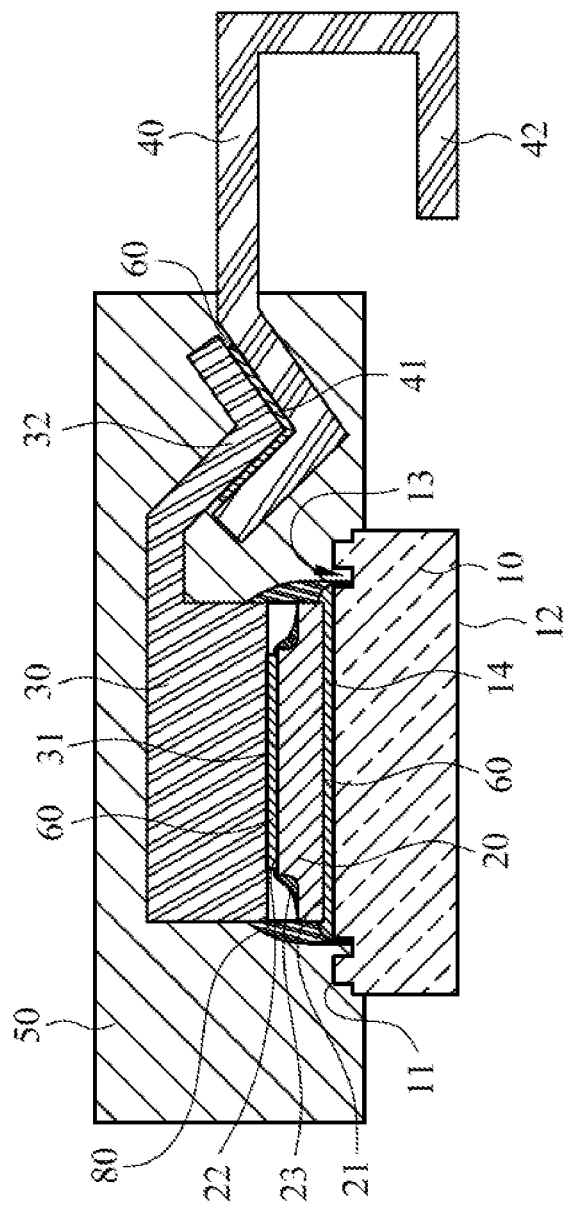
FIG. 7 is a lateral cross-sectional view of a die further coated with a protective layer according to the embodiment of the present invention.

Referring to FIG. 7, since the components are for use in a vehicle-related field or industrial field, ambient humidity is difficult to control, and temperature changes are abrupt. To prevent moisture from intruding through the gap of the black glue and an electrically conductive material, the die 20 is peripherally coated with a protective layer 80 to block moisture intrusion and prevent the die 20 from rusting because of moisture, thereby providing better protection to products and extending the service life of the products. The protective layer 80 is made of polymer, polysilicon, or varnish water.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A high-reliability semiconductor package structure, comprising:
    a lower heat sink made of a thermally conductive material and having an upper surface and a bottom surface, wherein an annular recess is formed on the upper surface to enclose an adhesion region of the upper surface;
    a die having a first surface fixedly coupled to the adhesion region and having a second surface opposing the first surface;
    an upper heat sink made of an electrically and thermally conductive material and having a connection portion and a first bending unit, the connection portion being adhered tightly to the second surface of the die, wherein an area of the connection portion is not less than an area of the second surface of the die;
    a lead frame made of an electrically conductive material and having a second bending unit and a bent pin, the second bending unit being adhered tightly to the first bending unit, wherein a portion of the bent pin and the bottom surface are coplanar; and
    a package body for enclosing the die, the upper heat sink, a portion of the lead frame, and a portion of the lower heat sink, wherein the bent pin and the bottom surface are exposed from the package body.

2. The semiconductor package structure of claim 1, being one of a DO-218(AB) package structure and a TO-220 package structure.

3. The semiconductor package structure of claim 1, being one of a transient state voltage suppressing chip and a Zener chip.

4. The semiconductor package structure of claim 1, wherein the adhesion region and the first surface are adhered tightly to each other by a solder, and the connection portion and the second surface are adhered tightly to each other by a solder.

5. The semiconductor package structure of claim 1, wherein both the second bending unit and the first bending unit have one of a V-shaped bend and a U-shaped bend corresponding in position to each other.

6. The semiconductor package structure of claim 5, wherein the second bending unit and the first bending unit are adhered tightly to each other by a solder.

7. The semiconductor package structure of claim 1 or 5, wherein the second bending unit and the first bending unit are adhered tightly to each other by a solder.

8. The semiconductor package structure of claim 1, wherein the bent pin has a first bending unit, a second bending unit, and a third bending unit, such that the third bending unit and the bottom surface are coplanar.

9. The semiconductor package structure of claim 1, wherein the package body is a black glue or an epoxy resin.

10. The semiconductor package structure of claim 1, wherein one of the upper heat sink and the lower heat sink is made of a pure copper or a copper alloy.

11. The semiconductor package structure of claim 1, wherein the die is peripherally coated with a protective layer.

* * * * *